United States Patent
Cavallera et al.

(10) Patent No.: US 9,520,712 B2
(45) Date of Patent: Dec. 13, 2016

(54) METHOD AND SYSTEM FOR CONTROLLING THE TURN-ON TIME OF A DEVICE THAT INCLUDES A MAGNETIC CIRCUIT

(75) Inventors: Didier Cavallera, Grenoble (FR); Jean-Louis Coulomb, Saint Ismier (FR); Olivier Chadebec, Grenoble (FR); Bruno Caillault, Herbeys (FR); Francois-Xavier Zgainski, La Murette (FR)

(73) Assignees: ELECTRICITE DE FRANCE, Paris (FR); INSTITUT POLYTECHNIQUE DE GRENOBLE, Grenoble (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 393 days.

(21) Appl. No.: 14/117,840

(22) PCT Filed: May 15, 2012

(86) PCT No.: PCT/EP2012/059029
§ 371 (c)(1),
(2), (4) Date: Nov. 14, 2013

(87) PCT Pub. No.: WO2012/156406
PCT Pub. Date: Nov. 22, 2012

(65) Prior Publication Data
US 2014/0097704 A1  Apr. 10, 2014

(30) Foreign Application Priority Data
May 16, 2011  (FR) ...................................... 11 54212

(51) Int. Cl.
*H01H 47/00* (2006.01)
*H01H 83/00* (2006.01)
(Continued)

(52) U.S. Cl.
CPC .......... *H02H 9/005* (2013.01); *G01R 33/0023* (2013.01); *G01R 33/02* (2013.01);
(Continued)

(58) Field of Classification Search
CPC .... H02H 9/005; H01F 2027/404; G01R 33/02
(Continued)

(56) References Cited

U.S. PATENT DOCUMENTS

2010/0013470 A1   1/2010  Tsutada et al.
2010/0187916 A1*  7/2010  Saito .................. G01R 33/0029
                                                                307/140

FOREIGN PATENT DOCUMENTS

DE   36 14 057 A1   10/1987
DE   43 12 764 A1   10/1994
(Continued)

OTHER PUBLICATIONS

Janet, F. et al., "Magnetic Moment and Reluctance Network Mixed Method Applied to Transformer's Modeling," *IEEE Transactions on Magnetics*, vol. 41, No. 5, May 1, 2005, XP011131949, pp. 1428-1431.
(Continued)

*Primary Examiner* — Carlos Amaya
(74) *Attorney, Agent, or Firm* — Blakely Sokoloff taylor & Zafman LLP

(57) ABSTRACT

A method and a system for controlling the switching time of a device that includes a magnetic circuit and a conductive winding. The method includes acquiring a measurement of the magnetic field generated by the residual flux, by a sensor placed near the magnetic circuit; processing the acquired measurements to infer the residual flux in the magnetic circuit; determining, on the basis of the residual flux, the optimal time for switching on the device. The method also includes switching on a three-phase transformer. The transformer includes a primary conductive winding and a secondary conductive winding surrounded by an enclosure. A magnetic field sensor is on the magnetic circuit and/or on one outer surface of the enclosure.

8 Claims, 5 Drawing Sheets

(51) Int. Cl.
  *H02J 7/00* (2006.01)
  *H02H 9/00* (2006.01)
  *G01R 33/00* (2006.01)
  *G01R 33/02* (2006.01)
  *G01R 33/14* (2006.01)
  *G01R 33/04* (2006.01)
  *H02H 7/04* (2006.01)

(52) U.S. Cl.
  CPC ............. *G01R 33/04* (2013.01); *G01R 33/14* (2013.01); *H02H 9/002* (2013.01); *H02H 7/04* (2013.01); *Y10T 307/826* (2015.04)

(58) Field of Classification Search
  USPC ........................................................ 307/125
  See application file for complete search history.

(56) References Cited

FOREIGN PATENT DOCUMENTS

DE   196 41 116 A1   4/1998
WO   WO 02/101405 A1   12/2002

OTHER PUBLICATIONS

Mercier, A., et al., "Transformer Controlled Switching Taking Into Account the Core Residual Flux—A Real Case Study," *CIGRE 13-201*, Paris, France, 2002, pp. 1-8.

Wildi, T., *Electrotechnique*, 3rd Edition, DeBoeck Universite, Ottawa, Canada, 2003, p. 455.

* cited by examiner

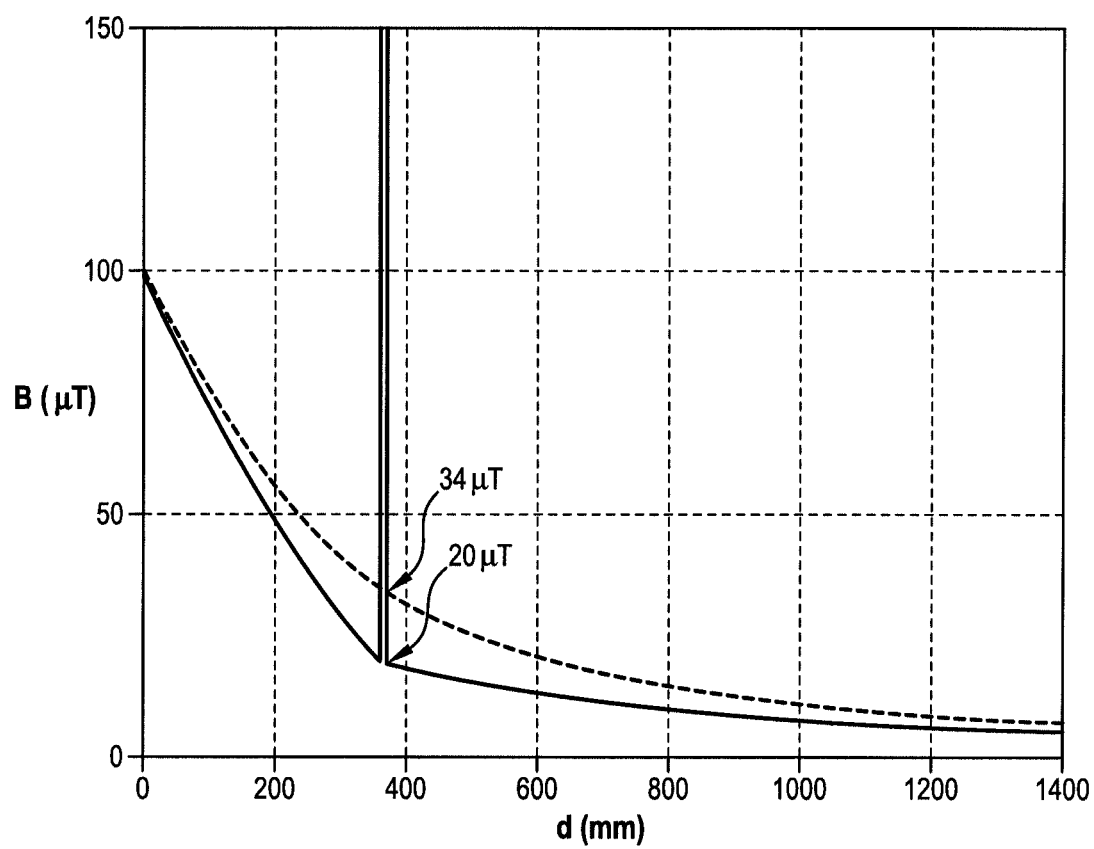

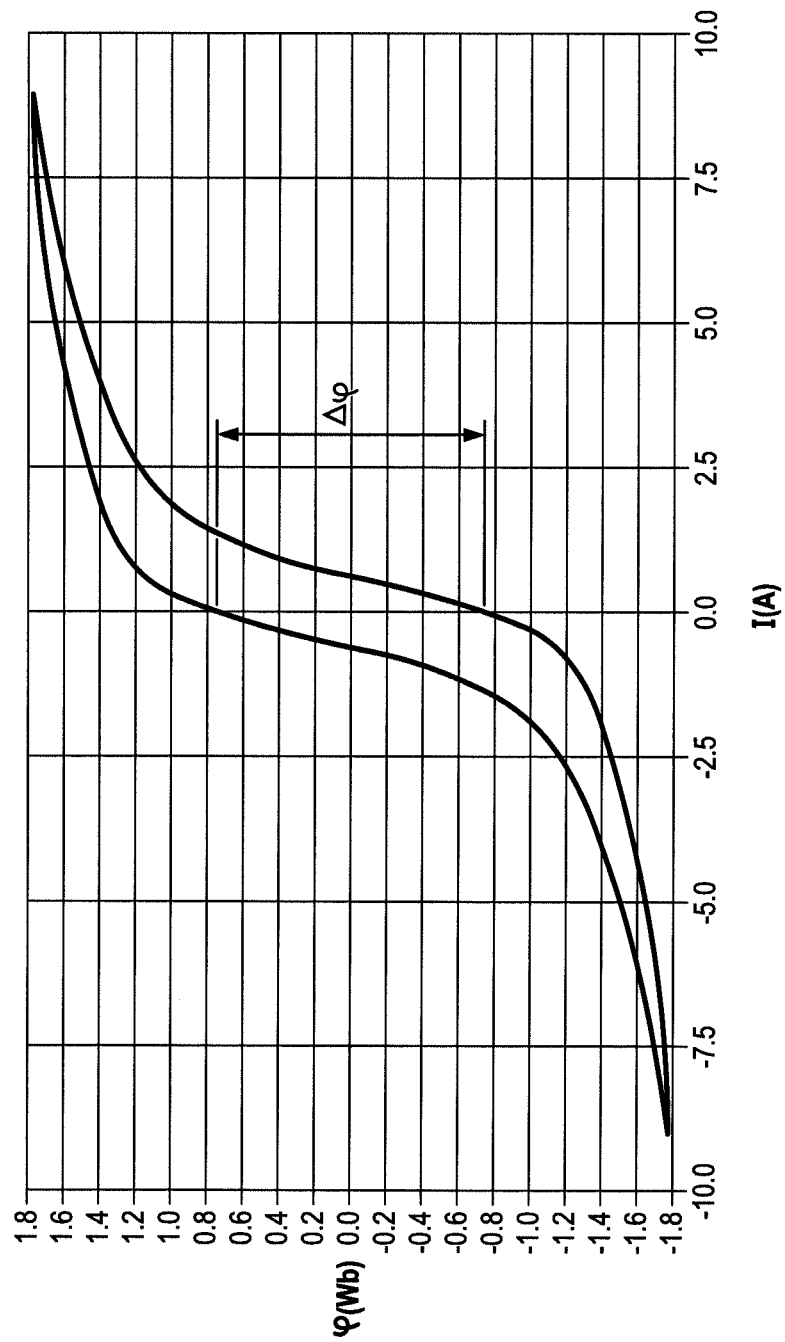

METHOD AND SYSTEM FOR CONTROLLING THE TURN-ON TIME OF A DEVICE THAT INCLUDES A MAGNETIC CIRCUIT

FIELD OF THE INVENTION

The present invention concerns a method and a system for controlling the switching time of a device including a magnetic circuit and at least one conductive winding.

BACKGROUND OF THE INVENTION

When a power transformer on an electrical transmission or distribution network is re-energized, it is known that transient over-currents can occur owing to a difference between the residual flux values in each part of the magnetic circuit and the fluxes generated by the voltages imposed at the terminals of each winding.

These over-currents rich in harmonics may, in some configurations of the network, exhibit values much higher than the transformer's permissible levels.

In addition, these over-currents may create major electrodynamic forces at the windings, leading to accelerate the degradation of the transformer (deformation, winding displacement).

These problems of over-currents and over-voltages can also be encountered in other electrical devices including a magnetic circuit and electric windings (start-up of electrical machines).

As an illustration, attention is given below to the case of a single-phase transformer.

Before energizing, the flux $\phi$ in the ferromagnetic material forming the magnetic circuit has a value $\phi_r$ called residual flux.

This residual flux is dependent on the de-energizing conditions of the transformer, which are generally not controlled, on the type of magnetic circuit (e.g. its geometry) and on the intrinsic parameters of its constituent material.

This residual flux is likely to develop over time, in particular on account of outside stresses which may be exerted upon the de-energized transformer (e.g. under the influence of electrical devices in the vicinity of the transformer).

At the time of energizing at t=0, since the applied voltage is an alternating voltage, the voltage at the terminals of the inductor winding can be written as: $V_0 = V\sqrt{2}\cos(\alpha)$ where:

V is the root mean square of the imposed voltage;

$\alpha$ is the angle representing the phase at the time of energizing.

$V_0$ therefore has a value that is solely dependent on $\alpha$.

To this value there is a corresponding flux $\phi_0$ imposed within the magnetic circuit. The operating equation is therefore the following:

$$V\sqrt{2}\cos(\omega t + \alpha) = Ri(t) + n\frac{d\phi(t)}{dt}$$

where:

$\omega$ is the voltage pulse

R is the total resistance of the electric circuit including that of the inductor winding n is the number of turns of the inductor winding $\phi$ is the mean flux within the magnetic circuit.

It is known that the expression of flux, with some approximations, is the following:

$$\phi(t) = \frac{V\sqrt{2}}{n\omega}\sin(\omega t + \alpha) + \left(\phi_r - \frac{V\sqrt{2}}{n\omega}\sin\alpha\right)e^{-t/\tau}$$

with:

$\tau = L/R$ and L is the inductance of the inductive winding.

It is then possible to determine the current i(t) as a function of the curve B(H) of the magnetic material of the circuit.

Optimal energizing of the transformer takes place at a given angle $\alpha$ such that the transient flux (and hence transient current) i.e. the maximum current reached after energizing, is as low as possible in order to protect the transformer.

For example, if $\phi_r = 0$ and $\alpha = 0$ (i.e. energizing at maximum voltage and no residual flux), then:

$$\phi(t) = \frac{V\sqrt{2}}{n\omega}\sin(\omega t)$$

which means that there is no inrush current. Energizing is therefore optimal.

On the other hand, if $\phi_r = \phi_{r\,max}$ and $\alpha = 3\pi/2$ (i.e. energizing at 0 voltage and maximum residual flux), then:

$$\phi(t) = -\frac{V\sqrt{2}}{n\omega}\cos(\omega t) + \left(\phi_{rmax} + \frac{V\sqrt{2}}{n\omega}\right)e^{-t/\tau}$$

In this case the flux reaches very high values leading to high inrush current or causes major temporary harmonic over-voltages on the network.

These two examples show the advantage of having knowledge of the value of residual flux.

One known solution for evaluating residual flux is based on the fact that voltage is homogeneous to flux derivation and therefore consists of evaluating residual flux by integrating the voltage at the terminals of the transformer before it is de-energized.

Said method is described for example in document US 2010/0013470.

Documents DE 196 41 116 and DE 36 14 057 also disclose methods using data on the state of the device before it is de-energized to estimate an optimal energizing time.

However, said indirect method for determining residual flux may, in some configurations of the electric network supplying the transformer, prove to be scarcely precise and scarcely robust since phenomena may have occurred which change the magnetic state of the magnetic circuit, and imprecision in measurement of voltage—which is the input data for calculating flux—makes this calculation little accurate (offset, drift, low voltage level, noisy signal).

Additionally, a long time may elapse between the de-energizing and energizing of a transformer, which requires the saving of data over a long period and regular measurement of flux to verify changes thereof.

It is one objective of the invention therefore to allow more precise, simple and reliable controlling of the switching time of a transformer or of any device comprising a magnetic circuit and one or more conductive windings through which a current passes when in operation, such as a rotating machine for example.

A further objective of the invention is to provide a simple and reliable method for energizing a transformer under optimal conditions.

A further objective of the invention is to design a system for determining residual flux in a magnetic circuit which provides better performance and is more precise than current systems and is easy to implement.

BRIEF DESCRIPTION OF THE INVENTION

According to the invention there is proposed a method for controlling the switching time of a device comprising a magnetic circuit and at least one conductive winding, characterized in that it comprises the steps of:

acquiring at least one measurement of the magnetic field generated by the residual flux in the said magnetic circuit, by means of at least one magnetic field sensor positioned in the vicinity of the magnetic circuit;

processing the acquired magnetic field measurements to infer therefrom the residual flux in the magnetic circuit;

from the residual flux, determining the optimal switching time.

All these steps are performed after de-energizing the device and do not require any knowledge or memorizing of the state of the device at the time of its de-energizing.

Said method advantageously comprises a prior step to calibrate the sensor whereby the transfer function is determined between the value of the magnetic field measured by the sensor and the value of residual flux in the magnetic circuit.

For this purpose, according to a first embodiment, at least one pair of sensors is placed on the magnetic circuit symmetrically relative to the said magnetic circuit, which allows the elimination by subtraction of the disturbing field component from the measurements acquired by the sensors, and the said transfer function is determined in relation to the values of the magnetic field measured by said pair of sensors and in relation to the relative permeability of the constituent material of the magnetic circuit.

According to one variant of embodiment of the calibration, at least one pair of sensors is placed in the vicinity of the magnetic circuit symmetrically relative to the said magnetic circuit, which allows the elimination by subtraction of the disturbing field component from the measurements acquired by the sensors; the calibration of the sensor then comprises a step to determine the integral, over one current period, of the voltage at the terminals of the winding when the current crosses zero, a step to determine induction when the current crosses zero using the hysteresis curve of induction in the magnetic circuit as a function of the intensity of the current circulating in the winding before de-energizing, and the determining of the transfer function from the said steps.

According to one particular embodiment of the invention, the said device comprises an enclosure surrounding the magnetic circuit and the winding, and at least one magnetic field sensor is then placed on an outer surface of said enclosure.

The invention also concerns the application of the preceding method to the energizing of a transformer whereby the transformer is energized at the optimal time determined by said method for each of the power input phases.

According to one particular embodiment of the invention in which the said device comprises several input phases, the above method is implemented to determine the value of the residual flux in the magnetic circuit for each of the phases of said de-energized device, and the optimal energizing time is calculated for the phase having the highest residual flux.

The invention also concerns the application of said method to the energizing of a three-phase transformer, whereby the input phase is energized which has the highest residual flux at the optimal time determined by the said method for the said input phase, after which the other input phases are simultaneously energized at a time when the voltage induced by the energizing of the first phase crosses a zero value.

A further objective of the invention concerns a system for controlling the switching time of a device including a magnetic circuit and at least one conductive winding.

This system is noteworthy in that it comprises:

at least one magnetic field sensor;

a system for acquiring the magnetic field measurements made by said sensor;

a system for processing the data acquired by the acquisition system, to calculate the residual flux in the magnetic circuit and, from the residual flux, to determine the optimal switching time of the device.

Finally, the invention also concerns a transformer comprising a magnetic circuit, at least one primary conductive winding and one secondary conductive winding, the said magnetic circuit and the said conductive windings being surrounded by an enclosure, the said transformer being provided, on the magnetic circuit and/or on or in the vicinity of an outer surface of the enclosure, with at least magnetic field sensor belonging to a system such as described above.

BRIEF DESCRIPTION OF THE DRAWINGS

Other characteristics and advantages of the invention will become apparent from the following detailed description with reference to the appended drawings in which:

FIG. 3 illustrates the induction measured on a path perpendicular to one surface of the magnetic circuit in FIG. 2A, with and without the enclosure;

FIG. 4 gives a curve of magnetic flux in the magnetic circuit as a function of the intensity of the current circulating in the winding before de-energizing;

DETAILED DESCRIPTION OF THE INVENTION

The device to which the method applies generally concerns a magnetic circuit, formed of a ferromagnetic material and one or more conductive windings which may or may not surround part of the magnetic circuit and through which a current is able to pass.

In addition, the magnetic circuit and the conductive winding(s) may be enclosed in an enclosure which is typically a steel plate enclosure.

This enclosure is particularly intended to contain the oil required for cooling the transformer.

The material of the enclosure does not form a barrier to the leakage field from the magnetic circuit so that it is possible to measure magnetic flux on the outer surface of the enclosure.

When applied to a transformer, one of the windings is connected to an alternating electricity supply source, and one or more additional windings are connected to an electric circuit to be supplied.

In this non-limiting example a description is given of a single-phase transformer, however the method applies in its principle in similar manner to any other device such as a three-phase transformer, rotating machine, etc.

Method for Determining Residual Flux

In general the method is based on the determination of residual flux in the magnetic circuit after de-energizing the device, by taking one or more measurements of the magnetic field generated by this residual flux in the vicinity of the magnetic circuit.

Knowledge of residual flux then allows determination of the optimal switching time.

Figure 1:
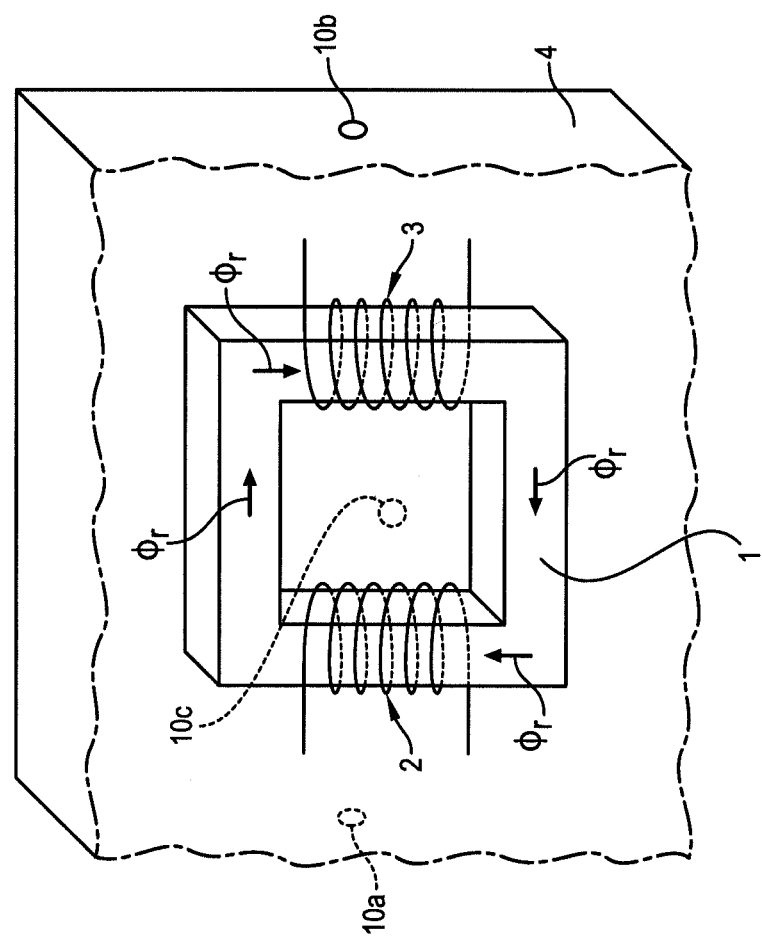
FIG. 1 is a schematic view of a single-phase transformer and of the magnetic field sensors.

FIG. 1 schematically illustrates a single-phase transformer.

This transformer comprises a magnetic circuit 1, a primary conductive winding 2 connected to an alternating electricity supply source and a secondary conductive winding 3 connected to an electric circuit to be supplied.

The magnetic circuit comprises a core in ferromagnetic material which in this FIG. 1 is shown to be homogeneous.

However, as is conventional, the magnetic circuit may have a laminated structure formed of a plurality of parallel sheets isolated from each other.

According to one particular embodiment, the magnetic circuit 1 and the primary and secondary windings 2 and 3 are surrounded by an enclosure 4 in the form of a steel plate jacket illustrated here in part.

When the transformer is de-energized, the flux circulating in the magnetic circuit is immobilized after a transient state and the result is a residual flux $\phi_r$ in the magnetic circuit 1.

To determine the value of this residual flux, one or more magnetic field sensors are placed in the vicinity of the magnetic circuit 1.

By "vicinity" in the present text is meant that the sensor is placed either on the magnetic circuit itself or at a sufficiently short distance so that the measurement of the magnetic field allows precise determination of the magnetic flux in the magnetic circuit.

As an example, it is considered here that the sensor is in the vicinity of the magnetic circuit if it is positioned at a distance therefrom that is shorter than the longest side of the said magnetic circuit.

There are two main magnetic field sources in a de-energized transformer: first the residual flux and secondly a disturbing field (mainly due to the earth's magnetic field).

If fields other than the earth's magnetic field form the disturbing field, then a system can be used to reject these perturbations. Signal processing methods are known for separating different magnetic field sources.

When a magnetic field is measured in the vicinity of the magnetic circuit, the measured value is a result of these two sources.

If an enclosure surrounds the magnetic circuit, it is possible to place the sensor(s) on the outer or inner surface of the enclosure or in the vicinity thereof, this enclosure not cancelling the leakage field.

It has been shown, in unexpected manner, that the induction measured outside the enclosure is sufficient to allow reliable measurement of the magnetic field generated by residual flux.

Figure 2B:
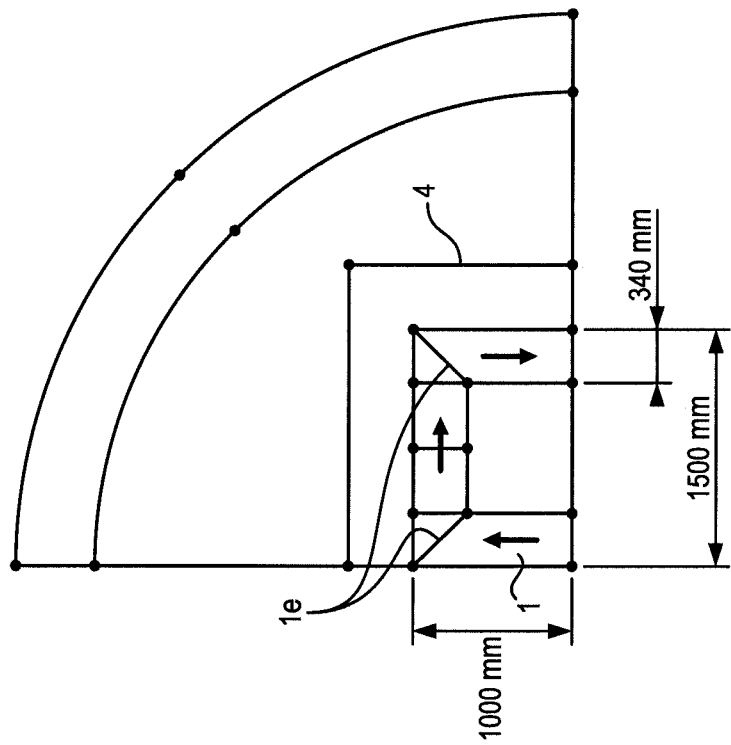
FIG. 2B illustrates the different values of the magnetic induction generated by the residual flux in the magnetic circuit shown FIG. 2A, outside the enclosure.
Figure 2A:
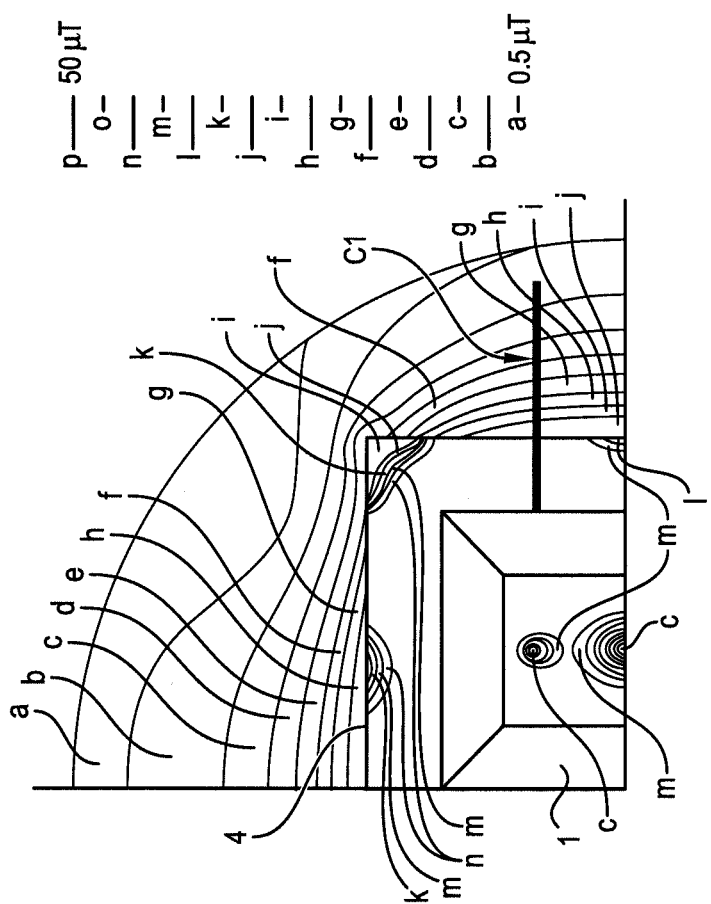
FIG. 2A illustrates a digital model of a portion of magnetic circuit and of an enclosure surrounding said circuit.

FIGS. 2A to 3 show simulations performed on a model of a portion of a circuit and of an enclosure surrounding said portion.

FIG. 2A illustrates a digital model of a portion of a magnetic circuit 1 and of an enclosure 4 surrounding said circuit.

Although only one quarter of the circuit is modelled, using Flux 2D software here, the digital simulation concerns the whole device.

The magnetic circuit is modelled in the form of a set of magnets each thereof having a specific direction of magnetization.

The magnets have a relative permeability of $\mu_{r1}$=5000 and residual induction $B_r$=1 T.

The imperfections of the magnetic circuit are modelled by air gaps 1e of 0.5 mm located in the corners of the magnetic circuit.

The arrows represent the orientation of the magnetic field lines in the magnetic circuit.

The metallic enclosure 4 has a relative permeability $\mu_{r4}$=100 and thickness of 1 cm.

FIG. 2B illustrates the different values of the magnetic induction generated by residual flux in the magnetic circuit 1 thus modelled, outside the enclosure 4.

The scale from a to p corresponds to iso-induction zones having a value of between 0.5 µT and 50 µT.

As can be seen, the magnetic induction in the vicinity of the enclosure has sufficiently high values to allow useful measurement by a magnetic field sensor placed in this zone.

This can be seen in FIG. 3 which illustrates the magnetic induction B measured on a path C1 (schematized in FIG. 2B) perpendicular to one side of the magnetic circuit 1, without the enclosure (dotted curve) and with the enclosure (solid line curve) as a function of the distance d from the magnetic circuit.

Therefore, in the presence of the enclosure, the induction measured immediately outside the enclosure is 20 µT, whilst the induction measured at the same point without an enclosure is 34 µT.

As a result, even if the enclosure alters the value of the magnetic field generated by residual flux, there is a trace outside the enclosure representing this magnetic field that can be measured and correlated with the real value by means of adequate calibration.

This can be accounted for by the fact that the magnetic fields generated by the device concerned by the invention are sufficiently high to generate a measurable trace outside the enclosure.

In the case of the simulation described herein a residual induction of 1 T of the magnetic circuit is represented by induction measured outside the enclosure of 20 µT.

Residual induction in the order of 1 mT would therefore be represented by induction outside the enclosure in the order of a few nT, which is higher than the precision of the sensors currently on the market and which is therefore measurable. Measurement using a sensor placed outside the enclosure can therefore be representative of residual induction provided that outside interferences can be ignored.

With reference to FIG. 1, three magnetic field sensors 10a, 10b, 10c were placed on three outer sides of the enclosure 4.

The preferred positioning and orientation conditions for the sensors are given further on.

Preferably the sensor(s) are positioned in the median plane of the magnetic circuit so that they have the best possible sensitivity to the magnetic field lines around the circuit.

For the positioning thereof any suitable securing mode can be used (adhesive, etc.) for securing onto the magnetic circuit and/or enclosure, even onto a support separate from the magnetic circuit or enclosure.

By means of the sensor(s) one or more magnetic field values are obtained in the vicinity of the magnetic circuit.

The said value or values are then processed to infer the value of the residual flux in the magnetic circuit.

As will be seen below, prior calibration of each sensor allows the determining of the transfer function between the value of the magnetic field measured by this sensor and the value of the residual flux.

Controlling the Switching Time

Knowledge of residual flux then allows determination of the optimal switching time.

Returning to the example of a single-phase transformer, if the value of $\phi_r$ is known, the optimal energizing angle $\alpha$ to minimize current inrush is inferred from the preceding equations using the formula:

$$\frac{V\sqrt{2}}{n\omega}\sin \alpha = \phi_r$$

i.e.:

$$\alpha = \arcsin\left(\frac{\phi_r n\omega}{V\sqrt{2}}\right)$$

The advantage of this method is that it does not require knowledge of the conditions under which the device was de-energized, which avoids having to archive the operating conditions of the device.

In addition, this method is more direct than the prior art integration methods, and is therefore more precise since it allows the overcoming of phenomena which may occur leading to modification of the magnetic state of the magnetic circuit, and also avoids inaccuracies of voltage measurement used as input data to calculate flux in prior art methods.

If the device is a three-phase transformer with three columns the residual flux is measured in each column by placing at least one magnetic field sensor on the magnetic circuit of each of the columns.

To energize the transformer, first the phase is energized for which the residual flux is the highest, the switching time being determined so as to minimize inrush current.

The energizing of the first phase generates a voltage induced in the two other phases, phase-shifted by 180° relative to the first phase.

After a time corresponding to a few half-periods of the said induced voltage (intended to reduce the asymmetry of the magnetic flux in the two phases to be energized), these two phases are simultaneously energized at a time corresponding to the zero-crossing time of the induced voltage.

This method of energizing is described in the article by A. Mercier et al., "Transformer Controlled Switching taking into account the Core Residual Flux—A real case study", CIGRE 13-201, 2002, to which reference can be made.

Evidently, any other triggering strategy can be chosen without departing from the scope of the present invention.

Calibration of the Sensor

The measurements made by means of the sensors allow a qualitative evaluation of residual flux, namely it presence and its direction.

For quantitative evaluation, i.e. to infer the value of the residual flux in the magnetic circuit from the measured magnetic field values, it is necessary beforehand to calibrate the sensor to determine the transfer function between the measured magnetic field and the corresponding residual flux.

To illustrate an example, the use is described below of two sensors placed close to a single-phase transformer not provided with an enclosure.

As will be seen below, the advantage of using two sensors arranged symmetrically is that it is possible to eliminate by subtraction the disturbing field component from the measurements acquired by the said sensors.

A distinction is made between the case in which the sensors are positioned directly on the magnetic circuit and the case in which the sensors are placed at a distance from the magnetic circuit.

Case 1: Sensors on the Magnetic Circuit

In this case, the tangential component of the magnetic field is measured, in the main direction of induction in the magnetic circuit.

The sensor must therefore be oriented in relation to the magnetic circuit so that it can measure this component.

This case is also valid when the sensor is placed sufficiently close to the magnetic circuit so that it is possible to measure the tangential component of the magnetic field at the circuit/air interface.

The induction measured by a sensor is defined by the formula:

$$B_{sensor} + A_1 \cdot B_0 + A_2 \cdot B_a$$

where:

$A_1$ is a magnitude depending both on the position of the sensor and on the induction in the magnetic circuit;

$B_0$ is the component of the disturbing field (chiefly the earth's magnetic field) in the direction of tangential induction;

$B_a$ is the main component of induction in the magnetic circuit, tangential to the interface between air and the magnetic circuit;

$A_2 = 1/\mu_a$ by maintaining the tangential magnetic field at the circuit/air boundary (Ampere's theorem);

$\mu_a$ is the relative permeability of the constituent material of the magnetic circuit.

If two sensors are positioned symmetrically on the magnetic circuit, the component of the disturbing field is modified in the same manner by the presence of the magnetic circuit.

The induction measurements taken by the two sensors are therefore written:

$$B_{sensor1} = A_1 \cdot B_0 + A_2 \cdot B_a$$

$$B_{sensor2} = A_1 \cdot B_0 - A_2 \cdot B_a$$

The subtraction of the measurements obtained by the two sensors allows the elimination of the disturbing field component and this gives:

$$B_{sensor1} - B_{sensor2} = 2A_2 \cdot B_a$$

The value of $B_a$ can therefore be inferred from the measurements obtained with the two sensors and from the relative permeability of the material of the magnetic circuit which is known.

It is then possible to determine the value of the flux circulating in the magnetic circuit which is given by the equation:

$$\phi_a = n \cdot B_a \cdot S_a$$

where n is the number of turns of the inductive winding and $S_a$ is the cross-section of the magnetic circuit.

Case 2: Sensors at a Distance from the Magnetic Circuit

When the sensor is not on the magnetic circuit, the induction measured by this sensor is expressed by:

$$B_{sensor} = A_1 \cdot B_0 + A_2 \cdot B_a$$

where the magnitudes $A_1$, $B_0$ and $B_a$ have the same definitions as in the preceding case.

On the other hand, the coefficient $A_2$ must be determined by the following steps:

1) Measuring the primary or secondary voltage (denoted V), magnetic induction (denoted B) measured by a sensor and the primary current (denoted I) when the transformer (no-load) is supplied with alternating voltage.

2) Plotting the curve $\phi(I)$ where $\phi$ is defined as the integral of voltage V as a function of time over a current period (i.e. 20 ms at 50 Hz). This curve is illustrated in FIG. 4. It is obtained firstly by calculating, over a current period, the integral $\phi$ of voltage as a function of time (which is of sinusoidal appearance phase-shifted by 90° relative to the voltage V) and secondly by measuring the variation in current I over the same period, and from these two series of data by plotting the hysteresis $\phi(I)$ curve. Said curve and the waveforms of voltage, flux and current are illustrated on page 455 for example of the work: Electrotechnique—$3^{ème}$ édition, by Théodore Wildi, De Boeck Supérieur, 2003.

It is to be noted that here integration is performed over a current period with a view to determining the transfer function of the sensor. This integration is therefore not affected by drifts contrary to the prior art methods mentioned above which use integration of voltage over a long period to infer residual flux therefrom.

Alternatively, the hysteresis curve $\phi(I)$ can be constructed from the saturation curve of the transformer which is supplied by the manufacturer of the transformer. The said saturation curve, plotted using a series of tests under no-load conditions, is a non-linear curve of voltage at the terminals of the primary winding as a function of the current. The corresponding hysteresis curve $\phi(I)$ can be plotted using adapted simulation software such as the EMTP software.

3) On the curve $\phi(I)$, measuring the magnitude $\Delta \phi$ which corresponds to the difference between the minimum and maximum values of $\phi$ when the current crosses zero (i.e. I=0).

Figure 5:
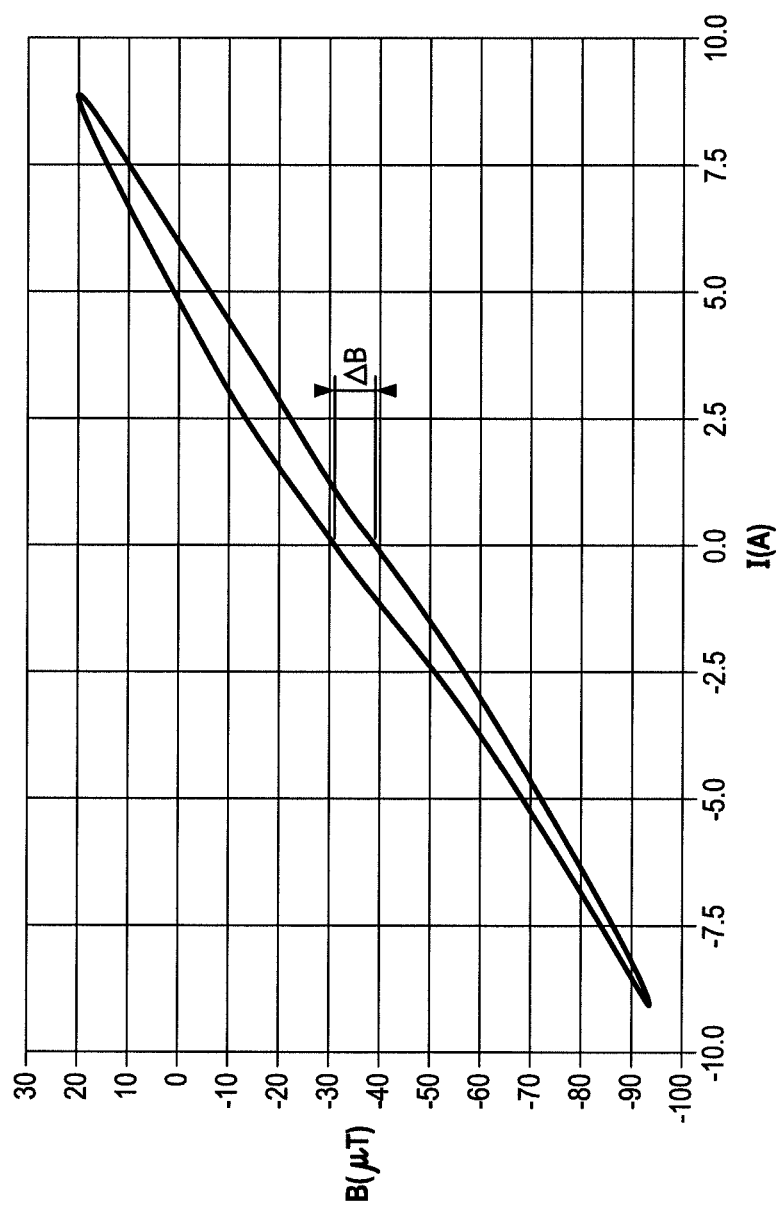
FIG. 5 gives a curve of induction in the magnetic circuit as a function of the intensity of the current circulating in the winding before de-energizing.

4) Plotting the curve B(I) illustrated in FIG. 5 from the measurements of magnetic induction obtained by the sensor at different times, and from the measurements of the primary current at the same times when the transformer (no-load) is fed with an alternating supply.

5) On curve B(I), measuring the magnitude $\Delta B$ which corresponds to the difference between the minimum and maximum values of B when the current crosses zero.

6) Calculating $A_2$ using the following formula:

$$A_2 = \frac{\Delta B}{\Delta \varphi / (n \cdot Sa)}$$

where n is the number of turns of the inductive winding and $S_a$ is the cross-section of the magnetic circuit.

When two sensors are positioned symmetrically relative to the magnetic circuit and to the disturbing field, the component of the disturbing field is modified in the same manner by the presence of the magnetic circuit.

The induction measurements performed by the two sensors are therefore written:

$$B_{sensor1} = A_1 \cdot B_0 + A_2 \cdot B_a$$

$$B_{sensor2} = A_1 \cdot B_0 - A_2 \cdot B_a$$

Knowing $A_2$, it is possible to infer $B_a$ therefrom using the measurements taken by the two sensors and by means of a subtraction which allows elimination of the disturbing field component:

$$B_{sensor1} - B_{sensor2} = 2 A_2 \cdot B_a$$

It is then possible to determine the value of the flux circulating in the magnetic circuit which is given by the equation:

$$\phi_a = n \cdot B_a \cdot S_a$$

Magnetic Field Sensors

The measurement system comprises at least one magnetic field sensor.

Sensors of this type exist on the market and persons skilled in the art are able to choose a suitable sensor model.

Advantageously the sensors are vector magnetometers of "fluxgate" type with one or three axes, adapted for measuring the magnetic field component along the axe or axes under consideration.

Magnetometers of this type are available from Bartington Instruments for example, under the reference Mag-03.

If the sensor is a single-axis magnetometer, and it is desired to position this sensor directly on the magnetic circuit, its axis is caused to lie parallel to the main direction of induction in the magnetic circuit in order to measure the tangential component of the flux.

The sensors may also be scalar magnetometers, measuring the magnetic field module. It is then necessary to orient these sensors in a direction parallel to the direction of the flux in the magnetic circuit.

Depending on the geometry of the magnetic circuit, it may be expedient to use at least two sensors arranged so as to facilitate or obtain better precision of residual flux determination.

For example, it is possible to arrange two sensors symmetrically on each portion of the magnetic circuit (in this example on each leg) of a single-phase or three-phase transformer having three columns.

As mentioned above, symmetrical positioning of the sensors makes it possible to overcome the influence of the earth's magnetic field.

Since the latter induces magnetic flux oriented from top downwards in the magnetic circuit, the positioning of the sensors so as to obtain components of opposite signs for residual flux makes it possible to eliminate the effect of the disturbing field.

In addition, in particular in complex devices, the fact that the sensor is positioned directly on the magnetic circuit makes it possible to ignore parasitic phenomena.

The number of sensors can also vary depending on the method used for calculating residual flux.

In principle, a small number of sensors is sufficient, for example one per portion of the magnetic circuit for a transformer.

However, it is also possible to determine residual flux from a plurality of point measurements of the magnetic field according to the method described in document WO 02/101405.

In this case, a plurality of magnetic field sensors must be placed around the magnetic circuit.

Also, the magnetic field sensor or sensors can be placed directly on the magnetic circuit.

However, said configuration in some cases may be difficult to implement since the immediate environment of the magnetic circuit may be unfavourable for the installing and functioning of the sensors (e.g. presence of fluids, high temperature, etc.).

In this case, it is also possible to place the sensor(s) on or in the vicinity of the enclosure surrounding the magnetic circuit.

When the distribution of the magnetic field around the circuit is known (for example by means of theoretical or experimental mapping) the sensor(s) are placed at the points where the magnetic field is the most intense.

In situations in which the distribution of the magnetic field is not known and/or the points for positioning the sensors are limited, it must be endeavoured to place pairs of sensors symmetrically relative to the disturbing field.

This solution away from the magnetic circuit has the advantage of not being intrusive and able to be implemented on existing devices without requiring modification thereof.

The sensor or sensors then lie at a distance from the magnetic circuit that is shorter than the dimension of the circuit, which allows sufficiently precise measurement of the magnetic field.

The sensors can be installed permanently on the enclosure.

When applicable this makes it possible to take real-time measurements of the magnetic state of the magnetic circuit when the device is energized, for diagnostic purposes.

A further possible application of the invention is the controlling of treatment of a transformer to cancel or modify residual flux in the magnetic circuit by means of an external source. The measurements performed by the sensors can then be used to verify whether or not the treatment has effectively allowed the desired flux to be obtained in the magnetic circuit.

The invention can also be implemented to control the start-up of a rotating machine, allowing measurement of residual flux in a non-powered machine.

Acquisition System

The acquisition system is adapted to collect the data from the different sensors, and to record and transmit this data to the processing system.

Processing System

The processing system is typically a processor provided with means which use the signals acquired by the acquisition system to compute the value of residual flux in the magnetic circuit.

In particular the processor can be adapted so that, from the signal associated with each sensor, it can compute residual flux from the transfer function of said sensor.

The acquisition and processing systems can be integrated in the device to be controlled, e.g. for a transformer described above in a box secured to the outside of the enclosure, or installed at a remote site.

The connection between the sensors and the acquisition and processing systems is obtained by means of any suitable electrical connection.

Finally, the examples that have just been given are evidently only particular illustrations and in no way limit the fields of application of the invention.

The invention claimed is:

1. A method for controlling a switching time of a device including a magnetic circuit and at least one conductive winding, comprising the steps of:
   acquiring at least one measurement of a magnetic field generated by a residual flux in the said magnetic circuit using at least one magnetic field sensor placed in the vicinity of the magnetic circuit;
   processing the acquired magnetic field measurements to infer therefrom the residual flux in the magnetic circuit,
   from the residual flux, determining the optimal switching time for energizing the device; all said steps being performed after de-energizing the device,
   the method further comprising a prior calibration step of the sensor wherein a transfer function between the value of the magnetic field measured by the sensor and the value of the residual flux in the magnetic circuit is determined.

2. The method of claim 1, wherein at least one pair of sensors is placed on the magnetic circuit symmetrically relative to said magnetic circuit, and the transfer function is determined in relation to the values of the magnetic field measured by said pair of sensors and in relation to the relative permeability of the constituent material of the magnetic circuit.

3. The method of claim 1, wherein at least one pair of sensors is placed in the vicinity of the magnetic circuit symmetrically relative to said magnetic circuit, and the calibration of the sensor comprises a step to determine the integral, over a current period, of the voltage at the terminals of the winding when the current crosses zero, and a determination step, on the hysteresis curve of induction in the magnetic circuit as a function of intensity of the current circulating in the winding before de-energizing, to determine induction when the current crosses zero, and determining of the transfer function from said steps.

4. The method of claim 1, wherein the device comprises an enclosure surrounding the magnetic circuit and the winding, and at least one magnetic field sensor is placed on an outer surface of the said enclosure.

5. A method for controlling the switching time of a device including a magnetic circuit and at least one conductive winding, wherein the device comprises several power input phases, said method comprising implementing the method of claim 1 to determine the value of the residual flux in the magnetic circuit for each of the phases of the de-energized device, and to calculate the optimal switching time for the phase having the highest residual flux.

6. The method of claim 5, wherein the device is a three-phase transformer, whereby the power input phase having the highest residual flux is energized at the optimal switching time determined for said input phase, then the other input phases are simultaneously energized at a time when the voltage induced by energizing the first phase crosses a zero value.

7. A system for controlling the switching time of a device including a magnetic circuit and at least one conductive winding, comprising:
   at least one magnetic field sensor;
   a system for acquiring magnetic field measurements performed by said sensor, the sensor being calibrated such that a transfer function between a value of a magnetic field measured by the sensor and a value of a residual flux in the magnetic circuit is determined;

a system for processing the data acquired by the acquisition system, to calculate the residual flux(es) in the magnetic circuit and, from the residual flux, to determine an optimal switching time.

8. A transformer comprising a magnetic circuit, at least one primary conductive winding and a secondary conductive winding, said magnetic circuit and said conductive windings being surrounded by an enclosure, said transformer further comprising, on the magnetic circuit and/or on or in the vicinity of an outer surface of the enclosure, at least one magnetic field sensor belonging to a system according to claim 7.

* * * * *